United States Patent
Fukumoto

Patent Number: 5,859,540
Date of Patent: Jan. 12, 1999

[54] CONSTANT TEMPERATURE CHAMBER IN A HANDLER FOR SEMICONDUCTOR DEVICE TESTING APPARATUS

[75] Inventor: Keiichi Fukumoto, Gyoda, Japan

[73] Assignee: Advantest Corporation, Tokyo, Japan

[21] Appl. No.: 705,859

[22] Filed: Aug. 28, 1996

[51] Int. Cl.$^6$ .............................. G01R 31/26; A21B 1/00
[52] U.S. Cl. ........................................ 324/760; 126/21 A
[58] Field of Search .............................. 324/760; 165/39;
361/231; 99/443, 339, 331; 126/21 A, 41 A,
45 A; 432/142, 144; 219/400, 681

[56] References Cited

U.S. PATENT DOCUMENTS

| | | | |
|---|---|---|---|
| 4,450,899 | 5/1984 | Jakobsson et al. | 165/39 |
| 4,492,839 | 1/1985 | Smith | 126/21 A |
| 5,055,963 | 10/1991 | Partridge | 361/231 |
| 5,153,815 | 10/1992 | Suzuki et al. | 361/386 |
| 5,205,274 | 4/1993 | Smith et al. | 126/21 A |
| 5,239,917 | 8/1993 | Lutkie et al. | 99/443 C |

*Primary Examiner*—Josie Ballato
*Assistant Examiner*—Anh Phung
*Attorney, Agent, or Firm*—Staas & Halsey

[57] ABSTRACT

A constant temperature chamber to be disposed in a handler for use with an IC tester is provided which is capable of preheating semiconductor devices to be measured to a preset temperature uniformly and in a short time. A rotary stage adapted to rotate with semiconductor devices to be measured loaded thereon is disposed in the bottom of the constant temperature chamber enclosed by thermal insulation walls. A heater is disposed in the upper portion of the constant temperature chamber. An axial-flow fan is positioned between the heater and the rotary stage. Further, a tubular flow-rectifying member is disposed surrounding and in proximity to the outer periphery of the axial-flow fan. A gas flow produced by rotatively driving the axial-flow fan is rectified by the flow-rectifying member with no turbulences occurring, and a circulating rectified gas flow is thereby formed from the axial-flow fan to pass through the rotary stage, and then advancing radially outwardly through between the undersurface of the rotary stage and the bottom thermal insulation wall of the constant temperature chamber, followed by rising in swirling streams along the interior of the thermal insulation walls of the chamber and flowing back to the axial-flow fan.

2 Claims, 4 Drawing Sheets

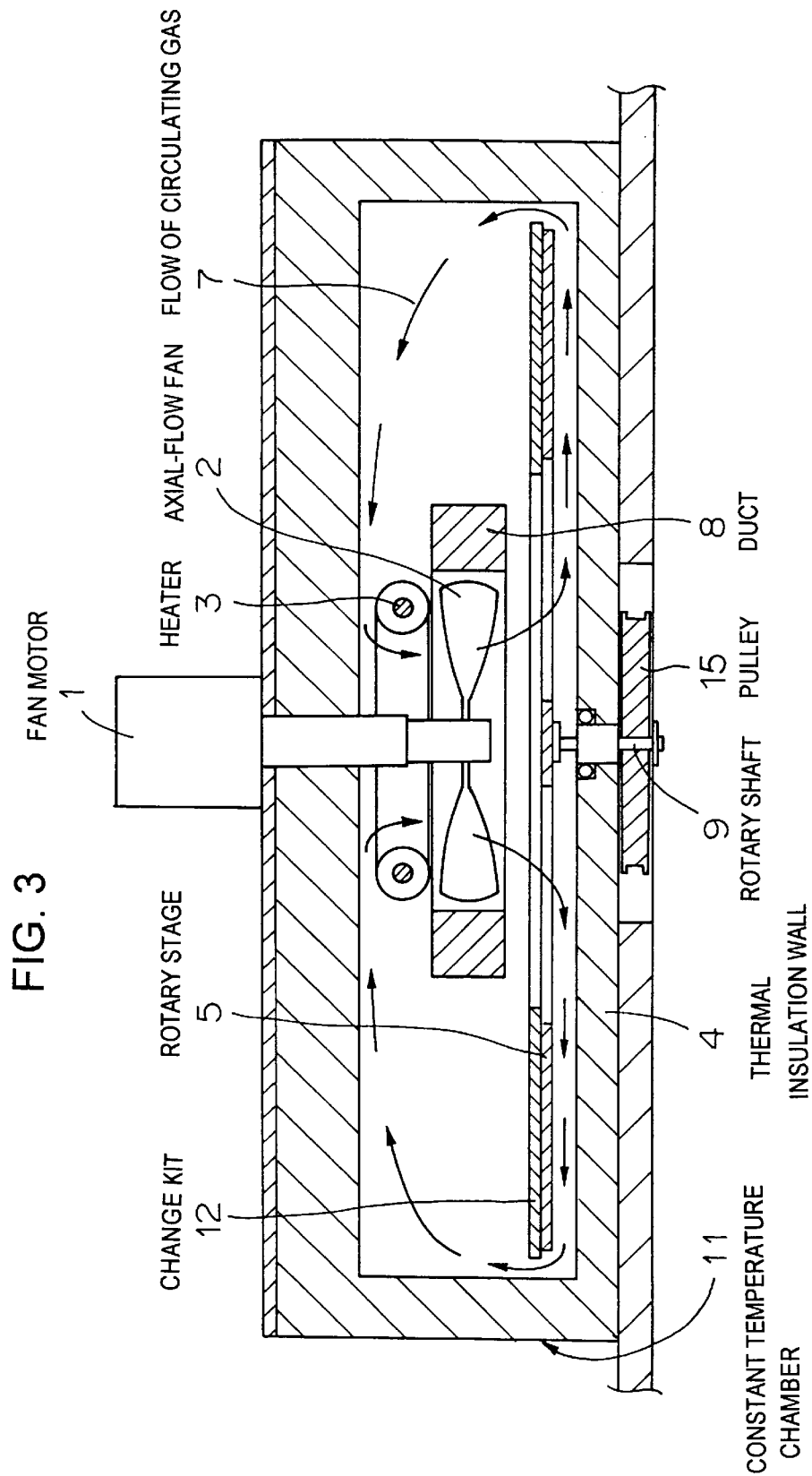

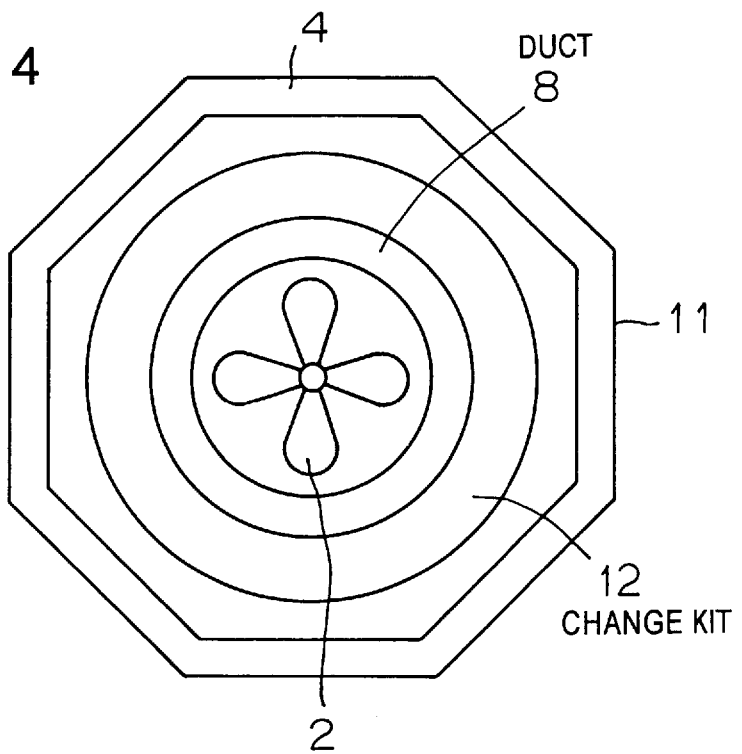

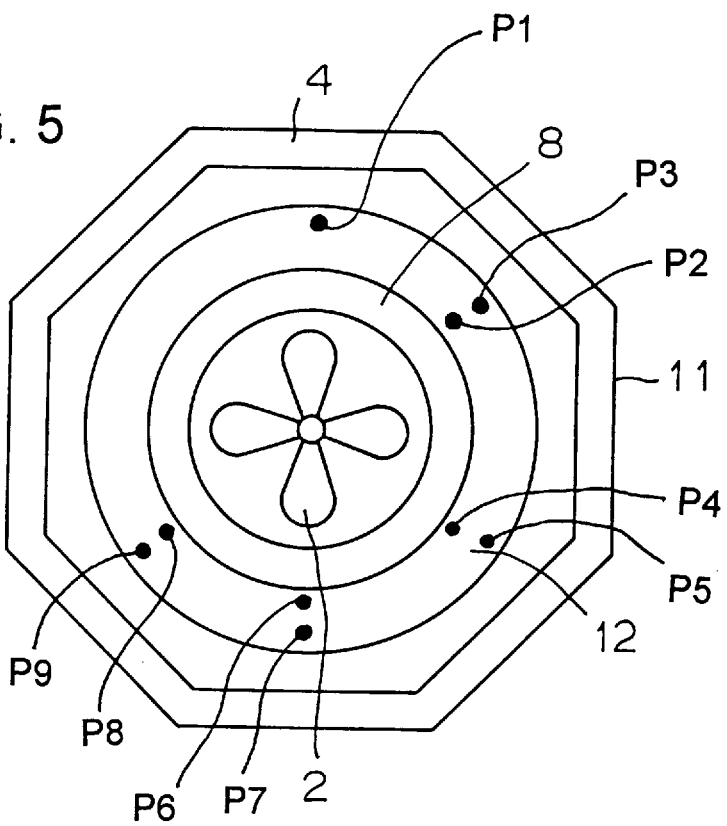

CONSTANT TEMPERATURE CHAMBER IN A HANDLER FOR SEMICONDUCTOR DEVICE TESTING APPARATUS

FIELD OF THE INVENTION

The present invention relates to a semiconductor device transporting and handling or processing apparatus (commonly called as handler) for transporting semiconductor devices to a test or testing section where the devices undergo a test, and upon completion of the test in the test section, carrying the tested devices out of the test section, and sorting them out on the basis of the test results, and particularly to the construction or structure of a constant temperature or thermostatic chamber for use in the semiconductor device transporting and handling apparatus of the type described for preheating the devices to be measured (tested) to a preset temperature.

BACKGROUND OF THE RELATED ART

Many of semiconductor device testing apparatus (commonly called as IC tester) for measuring the electrical characteristics of semiconductor devices to be tested (i.e. devices under test) by applying signals of a predetermined test pattern to the devices have a semiconductor device transporting and handling or processing apparatus (as will be referred to as handler) integrally mounted thereto. One of the measurement items for the electric characteristics of a semiconductor device, for instance, a semiconductor integrated circuit (hereinafter referred to as IC) which is a typical of semiconductor devices is the temperature characteristic. In order to measure the temperature characteristic of a device, it is required to heat the device under test by applying temperature to it in a preheating stage disposed within a constant temperature or thermostatic chamber of the handler maintained at a predetermined temperature. In this case, to shorten the test time, it is needed to heat a number of devices under test introduced and loaded onto the preheating stage in such a manner that they will reach, uniformly and in a short time, a predetermined temperature at which they are to be measured for their temperature characteristics. For the benefit of simplifying the description, the following description will be discussed with reference to ICs which are typical of semiconductor devices.

FIGS. 1 and 2 illustrate the construction of a prior art constant temperature chamber in the handler in which a preheating stage is provided for applying a temperature or hear to an IC to be measured until it reaches a predetermined set temperature in order to measure the temperature characteristic of it. As shown, the constant temperature chamber 11 is enclosed by thermal insulation walls 4 each having dimensions of about 600 mm×600 mm within which a rotary stage 5 (commonly called turntable) for preheating ICs is mounted. Attached to the top of the rotary stage 5 is a change kit 12 (which may be interchanged depending on the type, configuration, etc. of semiconductor devices to be tested) in the form of an annular disk onto which ICs 10 to be tested are introduced and loaded to be heated to a predetermined set temperature.

Shown in FIGS. 1 and 2 is the construction of the prior art constant temperature chamber 11 including the rotary stage 5 for preheating. The rotary stage 5 is rotated at a predetermined speed by means of a rotary shaft 9 secured thereto at the center thereof which is rotatively driven from a drive source (not shown) located above the chamber 11. Mounted exteriorly below the bottom wall of the chamber is a fan motor 1 for rotatively driving an axial-flow fan or axial blower 2 positioned inside of the chamber 11 at the bottom thereof. The arrangement is such that rotation of the axial-flow fan 2 directs the heat from a spiral heater 3 located above the fan 2 toward the overlying rotary stage 5. The rotary stage 5 includes a central perforated plate 6 having a number of through-apertures extending axially of the rotary shaft 9 (in upward-downward direction as viewed in FIG. 1). ICs 10 to be tested (commonly called DUT) are loaded on the change kit 12 outside of the perforated plate 6. It is thus to be understood that circulating gas (air) flows 7 as indicated by arrows occur in which the heated gas from the heater 3 is forced by rotation of the axial-flow fan 2 to pass through the perforated plate 6 and be directed towards the ICs 10 under test resting on the rotary stage 5 at its outer section, followed by passing around the outer periphery of the rotary stage 5 back to the axial-flow fan 2. The ICs 10 under test loaded on the rotary stage 5 are thereby heated up to a preset temperature.

Upon reaching the preset temperature, the ICs under test are removed from the rotary stage 5 and conveyed to a testing section not shown for effecting tests (measurements) within the constant temperature chamber 11 to be subjected to the necessary testing.

With the constant temperature chamber 11 having the built-in rotary stage 5 constructed according to the prior art as described above, there also occur gas streams flowing laterally outwardly from the axial-flow fan 2 as indicated by arrows in FIG. 1, resulting in non-uniform temperature rise among the ICs 10 under test resting on the outer section of the rotary stage 5. That is, increases in temperature are uneven depending upon the location on the rotary stage 5, resulting in being undesirably unable to uniformly raise the temperature of all of the ICs under test. This has led to the disadvantage that a considerably long time is required before all of the ICs under test are heated up to and stabilized at the preset temperature.

When ICs under test are to be measured for their temperature characteristics, it is required that ICs to be tested be introduced and loaded onto the outer section of the rotary stage 5 for preheating just before the measurement and be subjected to uniform heat so that all of the ICs are uniformly heated up. In addition, to reduce the test time, it is necessary, as indicated above, to heat all of the ICs to be tested loaded on the rotary stage up to a predetermined temperature in a uniform and reliable manner and yet in a short time. There is thus a need for a constant temperature chamber of such a construction as to enable the axial-flow fan 2 to provide its characteristic as much as possible in applying the heat from the heater to the ICs to be tested.

SUMMARY OF THE INVENTION

It is an object of the present invention to provide a constant temperature chamber for use in a handler for an IC tester, which is capable of raising the temperature of ICs to be tested up to a preset point in a short time and yet uniformly.

In the present invention, a tubular duct for creating efficient circulating flows of gas such as air within the constant temperature chamber is disposed in proximity to the outer periphery of the axial-flow fan for the purpose of making the best use of the properties of the axial-flow fan. The rotary stage is located below the axial-flow fan within the constant temperature chamber at the bottom thereof while the heater is positioned behind the axial-flow fan (above the axial-flow fan) in the direction of the gas flow such that the heat from the heater may be directed as warm air from above downwardly toward the central portion of the rotary stage by the axial-flow fan. A circuit path of circulating gas flow is thus formed in which the aforesaid blowing of warm air downwardly toward the rotary stage forces the warm air directed to the underneath of the rotary stage to advance outwardly while passing through between the undersurface of the rotary stage and the bottom wall of the constant temperature chamber, followed by rising in swirling streams along the interior of the thermal insulation walls and flowing back to the suction side of the axial-flow fan.

With the construction according to the present invention as described above, a circuit path for directing the circulating gas flow produced by the axial-flow fan is formed so that the circulating gas streams will flow in efficiently rectified streams with substantially no disturbances or turbulences in the gas flow. As a result, the gases within the constant temperature chamber enclosed by the thermal insulation walls are agitated to the desired degree so that the temperature of gases as heated by the heater comprising a heat source is rendered uniform. Consequently, it has been found possible to uniformly heat ICs to be tested introduced and loaded onto the rotary stage to thereby permit all of the ICs to uniformly reach a preset temperature in a short time.

BRIEF DESCRIPTION OF THE DRAWINGS

FIG. 3 is a schematic cross-sectional view illustrating the construction of an embodiment of the constant temperature chamber in a handler for an IC tester according to the present invention;

FIG. 4 is a plan view taken from top of the chamber shown in FIG. 3 with that portion of the chamber above the heater removed; a FIG. 5 is a plan view similar to FIG. 4, but showing nine ICs to be tested disposed on a change kit in the constant temperature chamber according to the embodiment of the present invention.

DESCRIPTION OF THE PREFERRED EMBODIMENT

Figure 1:
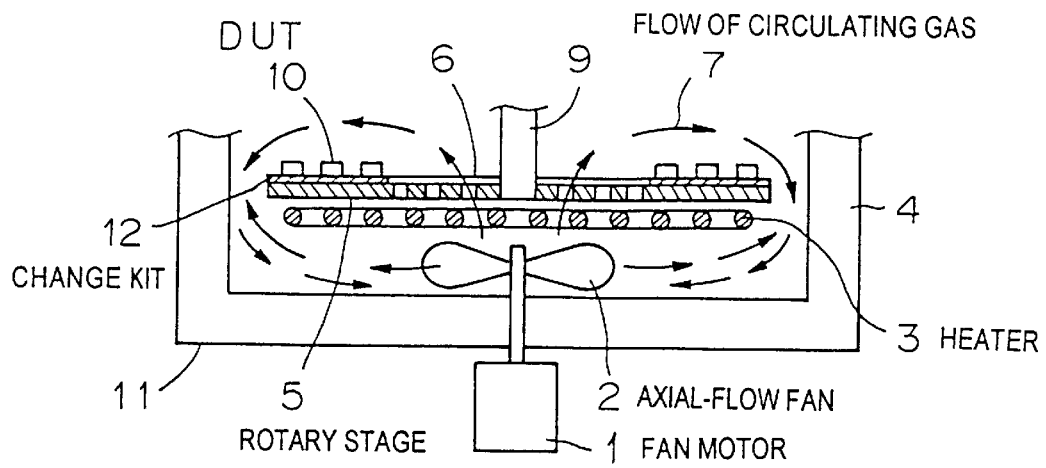
FIG. 1 is a schematic cross-sectional view illustrating the construction of an example of the prior art constant temperature chamber in a handler for an IC tester.
Figure 2:
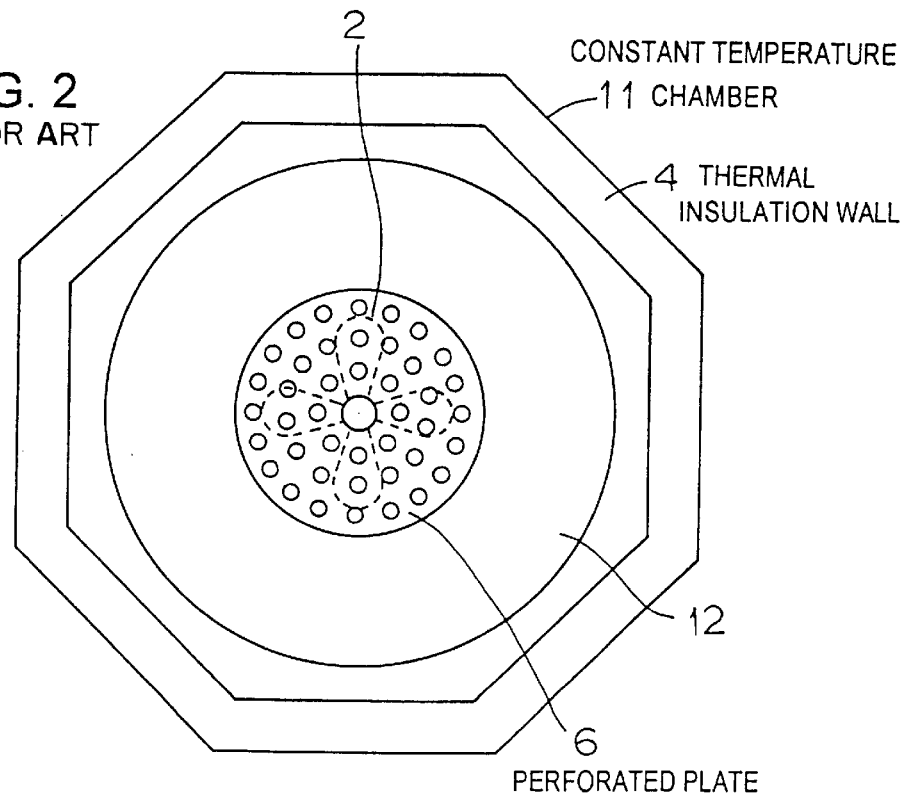
FIG. 2 is a plan view taken from top of the chamber shown in FIG. 1.

An embodiment of the present invention will be described with reference to the drawings.

Referring to FIG. 3, there is shown the construction of an embodiment of the constant temperature chamber according to the present invention in a handler for an IC tester. FIG. 4 is a plan view taken from top of the chamber shown in FIG. 3 with that portion of the chamber above the heater removed.

As shown in FIG. 3, in the illustrated embodiment a fan motor 1 is located on the top of a constant temperature chamber 11 exteriorly thereto. An annular heater 3 in the form of a ring is disposed in the chamber between an axial-flow fan 2 connected to the rotary shaft of the fan motor 1 and the top thermal insulation wall of the chamber 11. A rotary stage 5 is positioned in the bottom of the chamber 11. In addition, a cylindrical duct 8 is provided surrounding the axial-flow fan 2 with a small gap between the duct and the outer periphery of the fan.

The rotary stage 5 has attached to the top surface thereof an annular disk-like change kit 12 onto which ICs to be tested are to be introduced and loaded. The center and the radially outer section of the rotary stage 5 in this example are interconnected by six spiders (frames), not shown so that gas streams are substantially free to pass through the spiders. Obviously, the central section of the rotary stage 5 may comprise a perforated plate as in the prior art. The rotary stage 5 is rotated at a predetermined speed by the rotary shaft 9 being driven by a pulley 15 secured thereto exteriorly to the chamber 11 which pulley is in turn belt-driven from an appropriate drive source (not shown).

With this construction, it has been found that rotation of the axial-flow fan 2 driven by the fan motor 1 creates circulating gas flows 7 as shown by arrows in which the gas streams are forced by the axial-flow fan 2 to pass through the central opening of the rotary stage 5 to the underside of the rotary stage, whence they flow upwardly round the outer periphery of the rotary stage, followed by passing through the interior of the annular heater 3 back to the axial-flow fan 2. More specifically, it has been confirmed that the gas streams as blown downwardly by the axial-flow fan 2 are directed toward the underneath of the rotary stage 5 in rectified streams with substantially no turbulences by the duct 8 surrounding the outer periphery of the axial-flow fan 2 with a small gap. The gas streams directed toward the underneath of the rotary stage 5 are then forced to advance radially outwardly while passing through between the undersurface of the rotary stage and the bottom thermal insulation wall 4 of the constant temperature chamber 11, followed by rising in swirling streams along the interior of the peripheral thermal insulation walls 4 and flowing through the space where the heater 3 is located back to the suction side of the axial-flow fan 2 to complete the circulating flow of rectified gas streams.

As indicated above, the present invention is distinguished from the prior art in that the rotary stage 5 is located in the bottom of the constant temperature chamber 11 whereas axial-flow fan 2 is disposed above the rotary stage 5 with the heater 3 as a heat source being positioned above the axial-flow fan 2, the arrangement being such that the warm air is directed toward the center of the rotary stage 5 by the axial-flow fan 2. In addition, the cylindrical duct 8 is disposed surrounding and in proximity to the outer periphery of the axial-flow fan 2 to keep turbulences from occurring in the vicinity of the periphery of the axial-flow fan 2 as well as to intensify the blow of warm air directed by the axial-flow fan 2 toward the bottom of the constant temperature chamber.

Owing to the configuration of the constant temperature chamber completely distinguished from that of the conventional chamber in combination with the addition of the duct 8, the present invention is capable of preventing turbulences from occurring in the vicinity of the periphery of the axial-flow fan 2 and yet intensifying the blow of warm air, whereby a circuit path of the rectified circulating gas flow 7 is formed starting with the central portion of the rotary stage 5, going to and through the space between the rotary stage and the bottom thermal insulation wall 4, then to the space between the thermal insulation wall 4 and the top of the duct 8, and then through the region of the heater 3 back to the suction side of the axial-flow fan 2.

It has been found that the construction of the present invention as described above allows the gases in the constant temperature chamber 11 to be agitated efficiently and evenly and in cooperation with rotation of the rotary stage 5, permits all of the ICs introduced and loaded onto the change kit 12 overlying the radially outer section of the rotary stage 5 to reach a preset temperature uniformly and rapidly after the lapse of a predetermined short time of rotation of the rotary stage 5 with substantially no unevenness in the temperature reached with respect to the preset temperature or in the time at which the preset temperature is reached.

The present inventor heated nine ICs to be tested using a constant temperature chamber 11 configured as described herein above with reference to FIGS. 3 and 4. These ICs to be tested were positioned on the change kit 12 at positions P1 to P9 as indicated by black spots in FIG. 5. The ICs positioned as such were heated successively to four temperatures of 50° C., 75° C., 100° C. and 125° C. The results are as shown in the Table 1 below.

TABLE 1

| POSITION | 50° C. | 75° C. | 100° C. | 125° C. |
|---|---|---|---|---|
| P1 | 49.97 | 74.78 | 99.21 | 123.93 |
| P3 | 50.07 | 75.21 | 100.02 | 125.18 |
| P3 | 50.09 | 75.26 | 100.10 | 125.20 |
| P4 | 50.24 | 75.63 | 100.76 | 126.27 |
| P5 | 50.22 | 75.62 | 100.74 | 126.29 |
| P6 | 50.21 | 75.43 | 100.44 | 125.89 |
| P7 | 50.19 | 75.41 | 100.40 | 125.79 |
| P8 | 50.29 | 75.61 | 100.61 | 125.86 |
| P9 | 50.25 | 75.57 | 100.56 | 125.83 |

It will be appreciated from the Table 1 that the constant temperature chamber 11 according to the present invention is capable of heating ICs to be tested uniformly at whatever position on the change kit 12 they may be positioned. It was five minutes, ten minutes, fifteen minutes and twenty-five minutes that were required to heat the ICs from the room temperature to 50° C., 75° C., 100° C. and 125° C., respectively. This substantiates that the constant temperature chamber 11 according to the present invention is able to heating ICs to be tested uniformly in a short time irrespective of the position where they may be located on the change kit 12.

While the cylindrical duct 8 is employed as a member for rectifying the flow of gases blown by the axial-flow fan 2 in the illustrated embodiment, it will be apparent to one skilled in the art that any other suitable flow-rectifying member may be used. Furthermore, it is to be understood that the configuration and the construction of the axial-flow fan 2, heater 3, rotary stage 5, etc. as well as the drive means for the rotary stage 5 may be modified or varied as required. While ICs have been taken as an example of semiconductor devices in the foregoing description, it will be obvious that the present invention is applicable to the constant temperature chamber designed to heat semiconductor devices other than ICs with equal functional advantages.

As is apparent from the foregoing discussion, according to the present invention, a rotary stage is located in the lower portion of the constant temperature chamber, an axial-flow fan is disposed above the rotary stage, a heater which is a heat source is positioned above the axial-flow fan, and a cylindrical flow-rectifying member is disposed in proximity to the outer periphery of the axial-flow fan, the arrangement being such that the warm air is directed toward the central section of the underlying rotary stage by the axial-flow fan. This allows for forming a circuit path of circulating rectified gas flow with no turbulences involved in the flow to thereby permit all of the semiconductor devices to be measured loaded on the outer section of the rotary stage to be heated to a uniform temperature in a short time, wherever on the rotary stage they may be positioned.

Moreover, the construction described above of the constant temperature chamber in the handler allows the gases (air in the illustrated embodiment) in the chamber to be efficiently agitated to prevent the air heated by the heater from stagnating anywhere in the chamber. Consequently, no temperature unevenness occurs in the gases, resulting in the ability to raise the temperature of all of the semiconductor devices to be measured to a preset temperature uniformly and in a short time.

It is also to be appreciated that only the addition of a simple flow-rectifying member plus the relocation of the components of the constant temperature chamber is required to form a flow circuit for circulating the gases in the chamber as rectified streams, whereby the constant temperature chamber having the excellent performance as described above has been achieved at an extremely low initial cost without the need for substantial extra costs.

What is claimed is:

1. A constant temperature chamber for use in a semiconductor device transporting and handling apparatus for a semiconductor device testing apparatus for testing semiconductor devices, said semiconductor device transporting and handling apparatus transporting semiconductor devices to be measured to a test section where the devices undergo a test, and upon completion of the test in the test section, carrying the tested devices out of the test section, said constant temperature chamber comprising:

a rotary stage rotatably mounted in the bottom of the constant temperature chamber enclosed by thermal insulation walls and having its central section formed with through-aperture means for passage of gases and its peripheral section without through-aperture means for passage of gases, said rotary stage being spaced apart from the bottom thermal insulation wall of said constant temperature chamber and adapted to rotate in a generally horizontal plane with semiconductor devices to be measured loaded on said peripheral section thereof with no through-aperture means;

an axial-flow fan positioned above the central section of said rotary stage with the through-aperture means for passage of gases, said fan being rotatively driven by a drive source to create a path for circulating gases within said constant temperature chamber;

a tubular flow-rectifying member disposed surrounding and in proximity to the outer periphery of said axial-flow fan;

a heat source positioned above said axial-flow fan and spaced apart from the top thermal insulation wall of said constant temperature chamber, said heat source raising the temperature of the semiconductor devices to be measured loaded on said peripheral section of said rotary stare up to a preset temperature; and the central section of said rotary stage with the through-aperture means, said axial-flow fan positioned above the central section of said rotary stage, said tubular flow-rectifying member, and said heat source positioned above said axial-flow fan forming, in their cooperation, a circulating rectified gas flow in which the gases are forced to flow downwardly toward the bottom of said constant temperature chamber to pass through the central section of said rotary stage, and then flow outwardly through between the undersurface of the rotary stage and the bottom thermal insulation wall of the constant temperature chamber, and then flow upwardly along the side thermal insulation walls of the constant temperature chamber toward the top thermal insulation wall thereof, and flow inwardly along the top thermal insulation wall to said heat source, and flow downwardly through the heat source back to said axial-flow fan.

2. The constant temperature chamber in the handling apparatus according to claim 1 wherein said tubular flow-rectifying member is a tubular duct and said heat source is an annular heater in the form of a ring.

\* \* \* \* \*